United States Patent
Huo et al.

(10) Patent No.: US 8,133,751 B2
(45) Date of Patent: Mar. 13, 2012

(54) ONO SPACER ETCH PROCESS TO REDUCE DARK CURRENT

(75) Inventors: Jieguang Huo, Shanghai (CN); Jianping Yang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 92 days.

(21) Appl. No.: 12/238,696

(22) Filed: Sep. 26, 2008

(65) Prior Publication Data

US 2010/0009487 A1  Jan. 14, 2010

(30) Foreign Application Priority Data

Jul. 8, 2008 (CN) .................. 2008 1 0040366

(51) Int. Cl.
*H01L 21/00* (2006.01)
(52) U.S. Cl. .................. 438/57; 257/E27.133
(58) Field of Classification Search .......... 438/57, 438/595, 237, 258; 257/233, 292, 431–466, 257/E31.058, E31.063, E27.133–E27.139, 257/E31.115
See application file for complete search history.

(56) References Cited

U.S. PATENT DOCUMENTS

| | | | |
|---|---|---|---|
| 5,903,021 A | 5/1999 | Lee et al. | |
| 6,545,302 B2 | 4/2003 | Han | |
| 6,908,839 B2 | 6/2005 | Rhodes | |
| 2005/0040445 A1* | 2/2005 | Mouli | 257/290 |
| 2005/0179059 A1* | 8/2005 | Rhodes et al. | 257/204 |

FOREIGN PATENT DOCUMENTS

CN  101236925 A  8/2008

OTHER PUBLICATIONS

Office Action of Chinese Application No. 200810040366.6, dated May 25, 2010, 4 pages total (English translation not included).

* cited by examiner

*Primary Examiner* — Ha Tran T Nguyen
*Assistant Examiner* — Shaun Campbell
(74) *Attorney, Agent, or Firm* — Kilpatrick Townsend & Stockton LLP

(57) ABSTRACT

A method of forming a CMOS image sensor device. The method includes providing a semiconductor substrate having a P-type impurity characteristic. The semiconductor substrate includes a surface region. The method includes forming a gate oxide layer overlying the surface region and forming a first gate structure overlying a first portion of the gate oxide layer, the first gate structure has a top surface region and at least a side region. The method forms an N-type impurity region in a portion of the semiconductor substrate to form a photodiode device region from the N-type impurity region and the P-type impurity. The method includes forming a blanket spacer layer including an oxide on nitride on oxide structure overlying at least the first gate structure; and forming one or more spacer structures using the blanket spacer layer for the first gate structure while maintaining a portion of the oxide layer from the oxide on nitride on oxide overlying at least the photodiode device region.

12 Claims, 10 Drawing Sheets

ONO SPACER ETCH PROCESS TO REDUCE DARK CURRENT

CROSS-REFERENCES TO RELATED APPLICATIONS

This application claims priority to Chinese Application No. 200810040366.6, filed Jul. 8, 2008, commonly assigned, and hereby incorporated by reference for all purposes.

BACKGROUND OF THE INVENTION

The present invention is directed to integrated circuits and their processing for the manufacture of semiconductor devices. More particularly, the invention provides a method and a structure for manufacturing a CMOS image sensor device having a reduced dark current characteristics for advanced application. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed.

An example of such a limit is in image sensors especially in consumer applications. As demand for pixel sensitivity and pixel density increases, pixel layout and related integrated circuit design become more critical. These and other limitations will be described in further detail throughout the present specification and more particularly below.

From the above, it is seen that an improved technique for processing semiconductor devices is desired.

BRIEF SUMMARY OF THE INVENTION

According to embodiments of the present invention, a method of forming a CMOS image sensor device is provided. More particularly, the invention provides a method and structure for manufacturing a CMOS image sensor device having a reduced dark current. But it would be recognized that the invention has a much broader range of applicability. For example, the method can be applied to manufacturing other integrated circuits such as logic devices, memory devices, and others.

In a specific embodiment, the present invention provides a method to form a CMOS image sensor having a reduced dark current leakage. The method includes providing a semiconductor substrate. The semiconductor substrate can be single crystal silicon, silicon on insulator, silicon germanium and the like. The semiconductor substrate includes a surface region and a P-type impurity characteristic. The method includes forming a gate oxide layer overlying the surface region of the semiconductor substrate. The method forms a first gate structure overlying a first portion of the gate oxide layer. The method also includes forming an N-type impurity region in a portion of the semiconductor substrate to form a photodiode device from the N-type region and the P-type region. The method includes forming a blanket spacer layer including an oxide on nitride on oxide structure overlying the first gate structure. The method also forms one or more spacer structures using the blanket spacer layer for the first set of devices while maintaining a portion of the oxide layer from the oxide on nitride on oxide overlying at least the photodiode layer.

Many benefits are achieved by way of the present invention over conventional techniques. For example, the present technique provides an easy to use process that relies upon conventional technology. In some embodiments, the method provides higher device reliability and performance. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits and their processing for the manufacture of semiconductor devices are provided. In particular, the invention provides a method for manufacturing CMOS image sensor integrated circuit device. More particularly, the invention provides a method for manufacturing CMOS image sensor having a reduced dark current. But it would be recognized that the embodiments according to the present invention have a much broader range of applicability. Details of the present invention can be found throughout the present specification and more particularly below.

Figure 1:
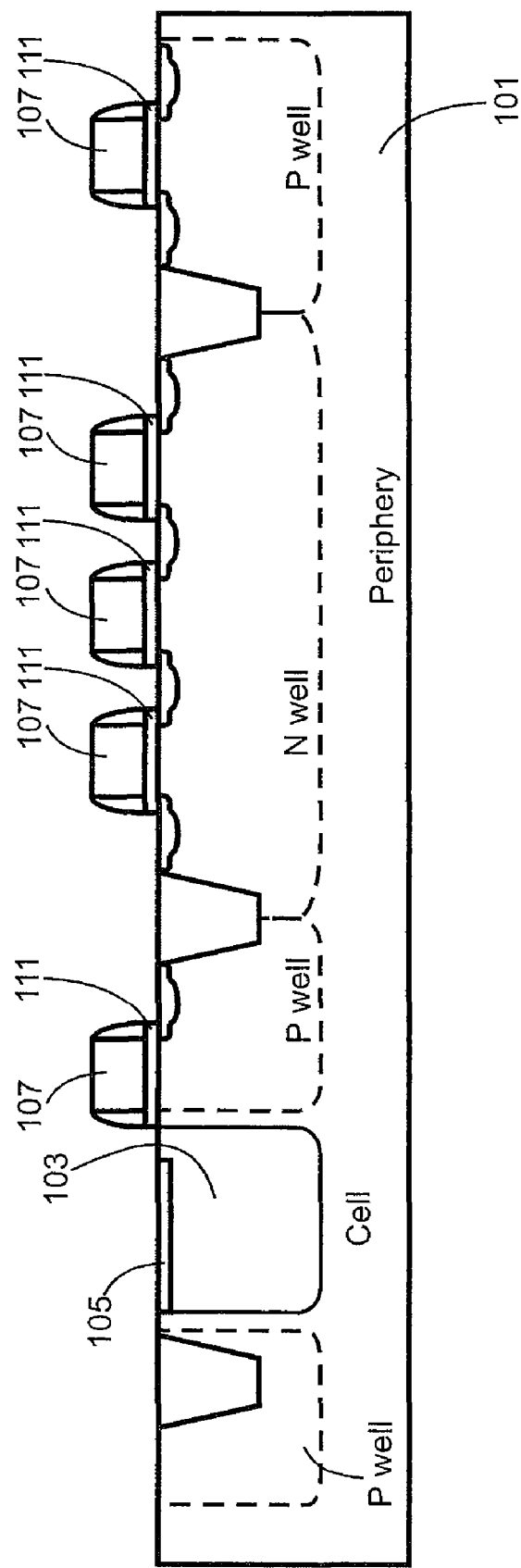
FIG. 1 is a simplified diagram illustrating a conventional method of fabricating a CMOS image sensor

CMOS image sensors are emerging as a preferred technology for digital consumer applications. To enable improved pixel sensing performance, CMOS image sensor technology requires improved pixel layout design and integrated circuit processing. Dark current is a major factor influencing sensor performance especially under a low light condition. Factors that may contribute to dark current include defects on the silicon surface and silicon-gate oxide interface in photodiode regions and surrounding regions. Convention fabrication techniques may become in-effective for high density pixel CMOS image sensor layout. FIG. 1 is a simplified diagram illustrating a conventional method of fabricating a CMOS image sensor. As shown, a semiconductor substrate 101 is provided. For example, the semiconductor substrate can be single crystal silicon doped using a P-type impurity. Also shown in FIG. 1 is a photodiode region 103 doped with N type impurities. A P type impurity region 105 is formed overlying the photodiode region or a pinned photodiode structure is shown. The P-type impurities on the surface is provided to prevent surface dark current leakage. The conventional method of fabricating the CMOS image sensor also includes forming a gate structure 107 overlying a gate oxide layer 111. The gate oxide layer can be a grown thermal oxide. The conventional method includes steps of implantation in source/drain regions and channel regions. Thereafter, a blanket dielectric layer is deposited overlying the gate structure. The blanket dielectric layer often includes silicon oxide. The blanket dielectric layer is subjected to an anisotropic etch process to form spacer structures overlying portions of the gate structure. In the conventional method, the spacer etch step also includes masking the photodiode region to prevent damage to the thermal oxide overlying the photodiode region. For example, the photodiode region can be masked using photoresist material to mask the blanket dielectric layer overlying the photodiode region. The blanket dielectric layer remains on the photodiode region. In this instant, the blanket dielectric layer is limited to materials that are transmissible to light, such as silicon dioxide. However, certain dielectric material may impede light transmission to the photo sensitive regions and hence performance of the CMOS image sensor device. These and other limitations would be described in more detailed in the present specification and particularly below.

Figure 2:
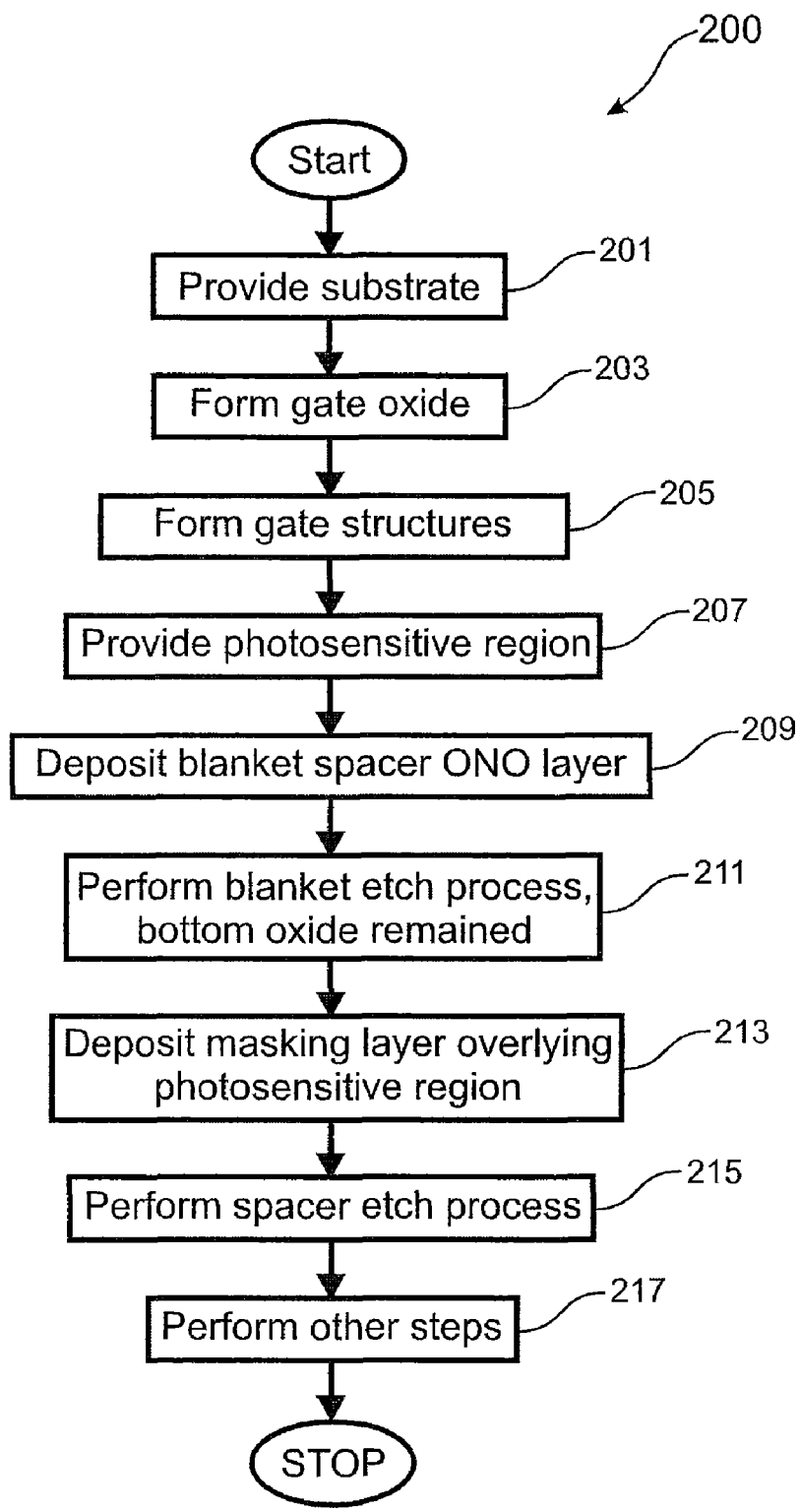
FIG. 2 is a simplified process flow diagram exemplified a method for forming a CMOS image device according to an embodiment of the present invention

FIG. 2 is a simplified process flow diagram exemplified a method 200 for forming a CMOS image device according to an embodiment of the present invention. As shown, the method includes providing a semiconductor substrate (Step 201). The semiconductor substrate can be a single crystal silicon, silicon on insulator, silicon germanium, or the like. In a specific embodiment, the semiconductor substrate is a silicon substrate doped with a suitable impurity. In a preferred embodiment, the silicon substrate is doped with a P type impurity such as boron. The method includes forming a gate dielectric layer (Step 203) overlying the semiconductor substrate. The gate dielectric layer can be formed using a grown oxide such as thermal oxide. Other dielectric material may also be used. The method includes forming gate structures overlying portions of the gate dielectric layer (Step 205). The method includes providing a photosensitive region within a portion of the semiconductor substrate (Step 207). The photosensitive region can be formed using an implant process. For a P-type silicon substrate, the photosensitive region can be doped using a N type impurity. Example of such N-type impurity may include arsenic, antimony, phosphorus, and the like. The method also forms a blanket dielectric layer overlying the semiconductor substrate and the gate structure (Step 209). In a specific embodiment, the blanket dielectric layer comprises a composite dielectric such as an ONO layer. The ONO layer includes a bottom silicon oxide layer, a middle silicon nitride layer, and a top silicon oxide layer. Of course there can be other variations, modifications, and alternatives.

In a specific embodiment, the method also includes an etching process to remove the top silicon oxide layer, the middle silicon nitride layer and a portion of the bottom silicon oxide layer overlying the semiconductor substrate (Step 211). The method includes depositing a masking layer overlying the photosensitive region (Step 213) and performing a spacer etch process (Step 215) The spacer structures isolate the gate structure from active regions in the semiconductor substrate in a specific embodiment. In a preferred embodiment, the spacer structures are formed using a blanket spacer etch process, which can be a anisotropic etch. The blanket spacer etch process leaves a portion of bottom silicon oxide overlying the semiconductor substrate and top portion of the gate structure. The method then masks the photosensitive region (Step 213) and removing remaining oxide in other regions on the semiconductor substrate and from the top region of the gate structure. The method continues with other steps to complete the image sensing device (Step 215). Of course one skilled in the art would recognize many other variations, modifications, and alternatives.

The above sequence of steps provide a method for fabricating a CMOS image sensor according to an embodiment of the present invention. As shown, the method includes a step of providing a spacer etch process without causing damage to the gate oxide layer or the interface region between the silicon and the gate oxide layer overlying the photodiode region Alternatively steps may be added, deleted, or performed in a different order depending on the specific embodiment.

Figure 3:
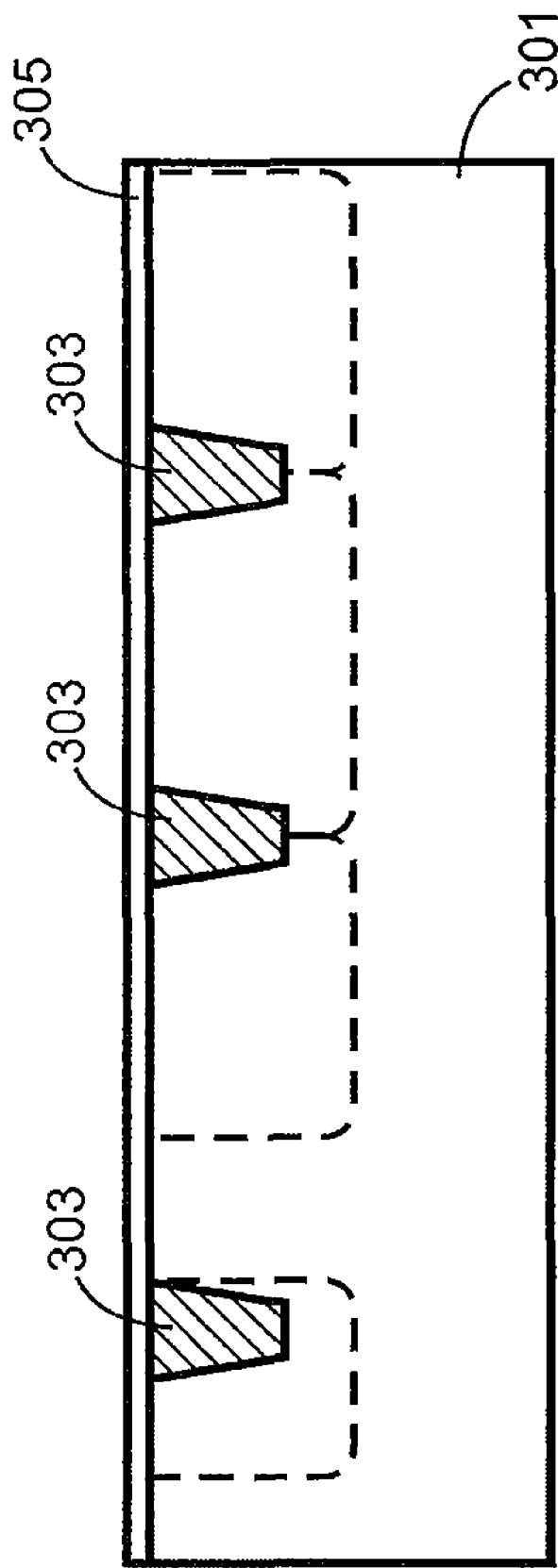
FIG. 3-9 are simplified diagrams illustrating a method of forming a CMOS image sensor according to an embodiment of the present invention.

FIGS. 3-9 are simplified diagrams illustrating a method for fabricating a CMOS image sensing device according to an embodiment of the present invention. These diagrams are merely examples and should not unduly limit the claims herein. One of ordinary skill in the art would recognize many variations, modifications, and alternatives. As shown in FIG. 3, a semiconductor substrate 301 is provided. The semiconductor substrate can be single silicon, silicon on insulator, silicon germanium or the like. In a specific embodiment, the semiconductor substrate is a silicon wafer doped with suitable impurities. For example, the semiconductor substrate can be a silicon wafer doped with a P type impurity such as boron. The method also forms isolation regions 303 within the substrate. In a specific embodiment, the isolation region can be shallow trench isolation (STI) region formed within a portion of the semiconductor substrate. The STI regions can be formed using patterning, etching followed by a trench fill using a dielectric fill material within the trench region. The trench fill dielectric material is usually silicon oxide, silicon nitride or a combination depending on the embodiment. The isolation region isolates active regions within the substrate. Of course, there can be other variations, modifications, and alternatives.

In a specific embodiment, the method includes forming a gate dielectric layer 305 overlying the semiconductor substrate as shown in FIG. 3. Gate dielectric layer preferably includes a dense dielectric material having a good quality such as a thermal oxide. Other materials such as silicon nitride or silicon oxynitride may also be used depending on the specific embodiment.

Figure 4:
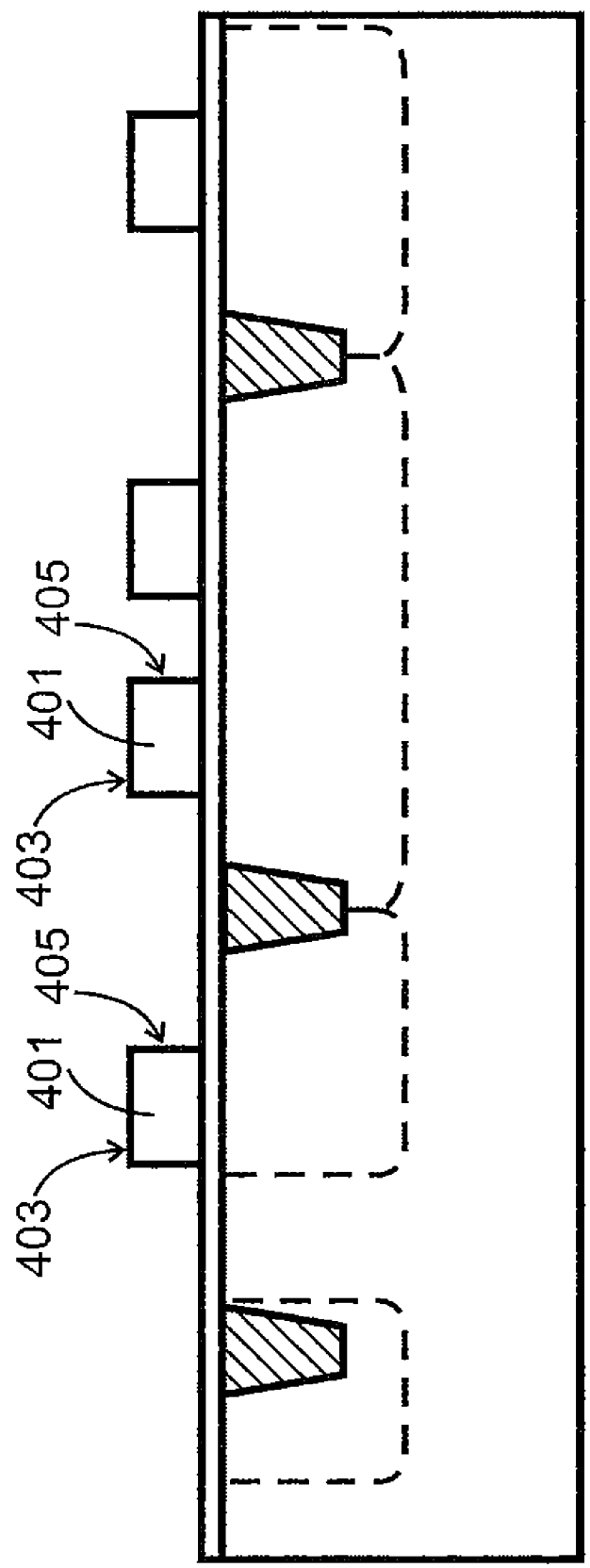

Referring to FIG. 4, the method forms a gate structure 401 overlying the semiconductor substrate. The gate structure has a top region 403 and side region 405. The gate structure can be formed using polysilicon doped with a suitable impurity. Of course there can be other variations, modifications, and alternatives.

Figure 5:
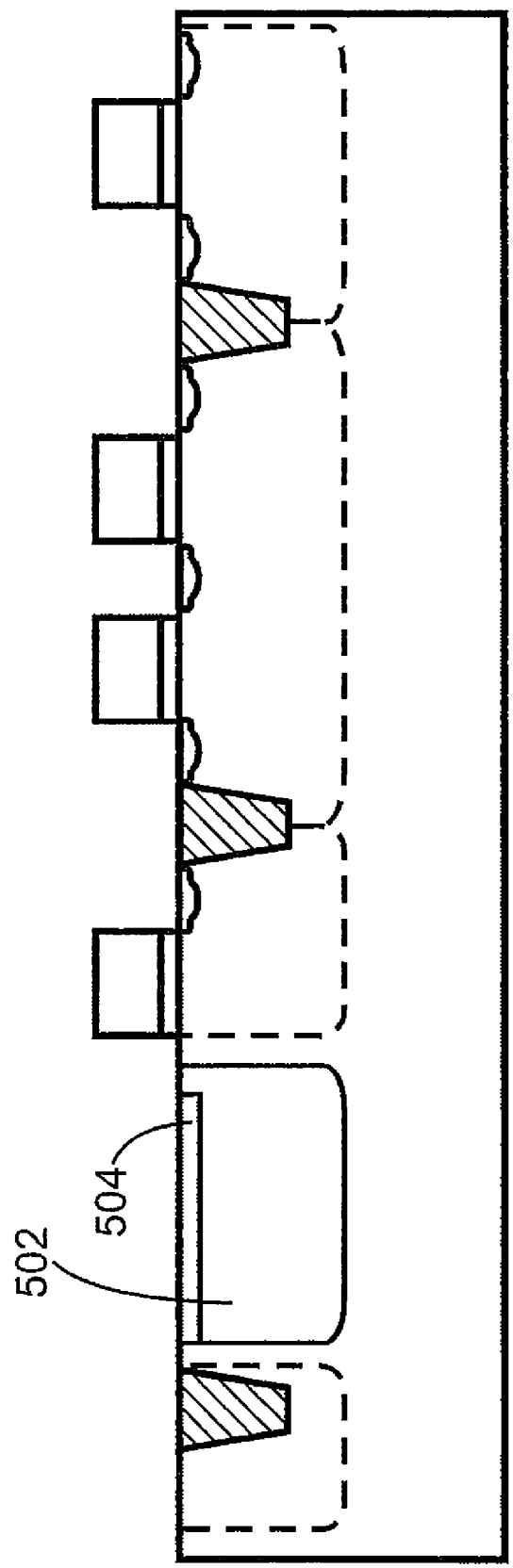

In a specific embodiment, the method forms a photosensitive region 502 in a portion of the semiconductor substrate as shown in FIG. 5. For a P-type substrate, for example, the photosensitive region can be formed using a N-type impurity such as arsenic, phosphorus, antimony, and others. In a specific embodiment, the method also forms a P-type region 504 in a surface region in a portion of the photosensitive region. P-type region 504 provides pinning to the surface region of the photosensitive region, which is doped with N type impurity. Pinning reduces certain dark current leakage in the surface region of the photosensitive region. Of course there can be other variations, modifications, and alternatives.

Figure 6:
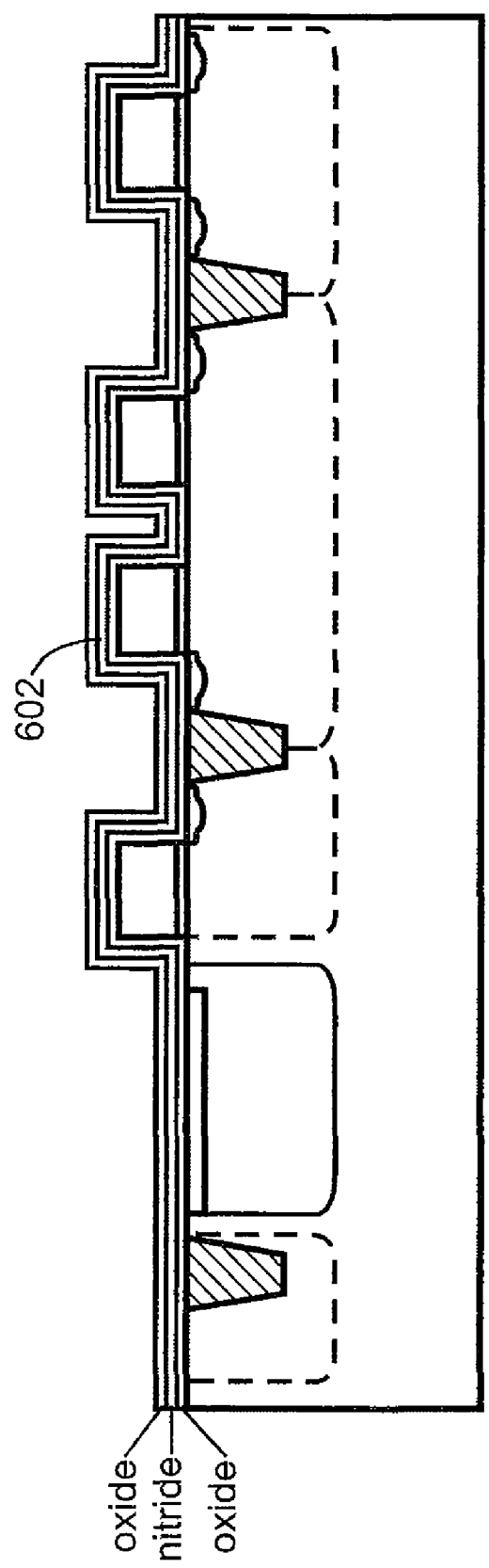

Referring to FIG. 6, the method includes forming a blanket dielectric layer 602 overlying the gate structure and exposed portions of the gate dielectric. The blanket dielectric layer can be form using dielectric material such as silicon oxide, silicon nitride or a combination. In a specific embodiment, the blanket dielectric layer is provided using a composite dielectric material such as an oxide on nitride on oxide dielectric stack, commonly called ONO. (a silicon nitride layer sandwiched between a top silicon oxide layer and a bottom silicon oxide layer). Of course there can be other variations, modifications, and alternatives.

Figure 7:
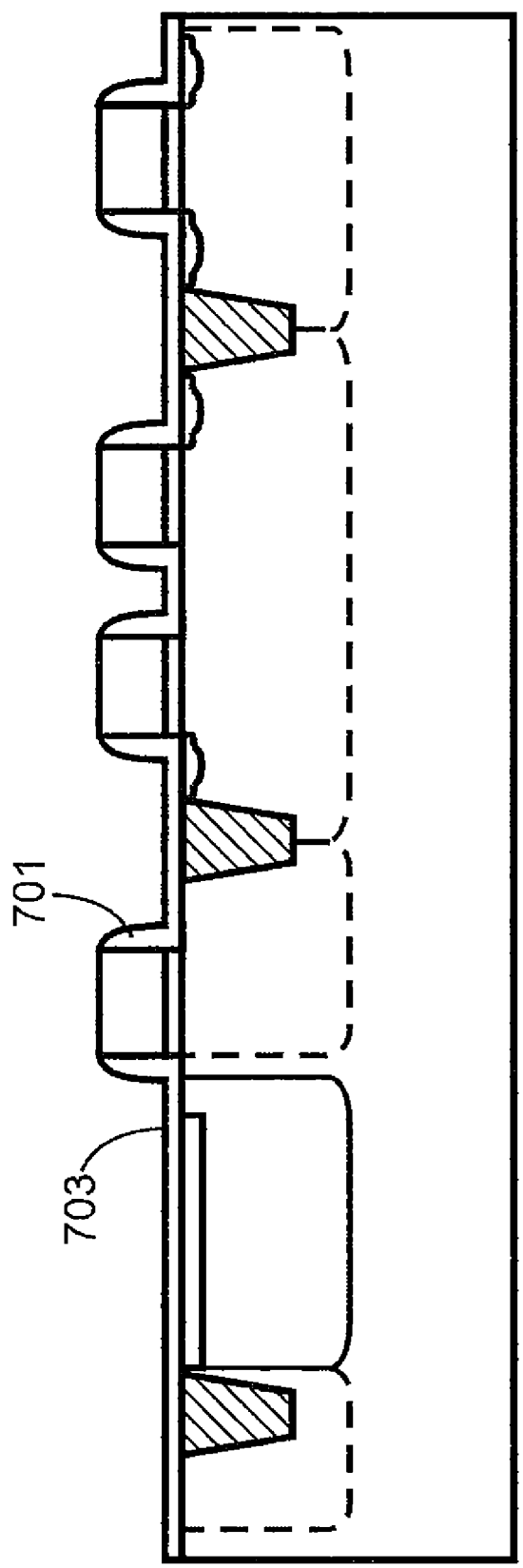

As shown in FIG. 7, the blanket dielectric layer is subjected to a blanket etching process to form spacer structures 701 overlying the gate structure. The blanket etching process removes the top silicon oxide layer, the silicon nitride layer, and a portion of the bottom silicon oxide layer overlying the substrate. The bottom silicon oxide layer acts as a stop layer 703 in a specific embodiment. In a preferred embodiment, the remaining bottom silicon oxide layer in the photodiode region ranges from 80 Angstroms to 200 Angstroms and is completely free from silicon nitride. The light transmission to the photosensitive region is therefore not adversely affected. The remaining bottom silicon oxide layer in the photodiode region also acts as a protective layer for the gate dielectric layer and the gate dielectric substrate interface in the photosensitive region. Of course there can be other variations, modifications, and alternatives.

Figure 8:
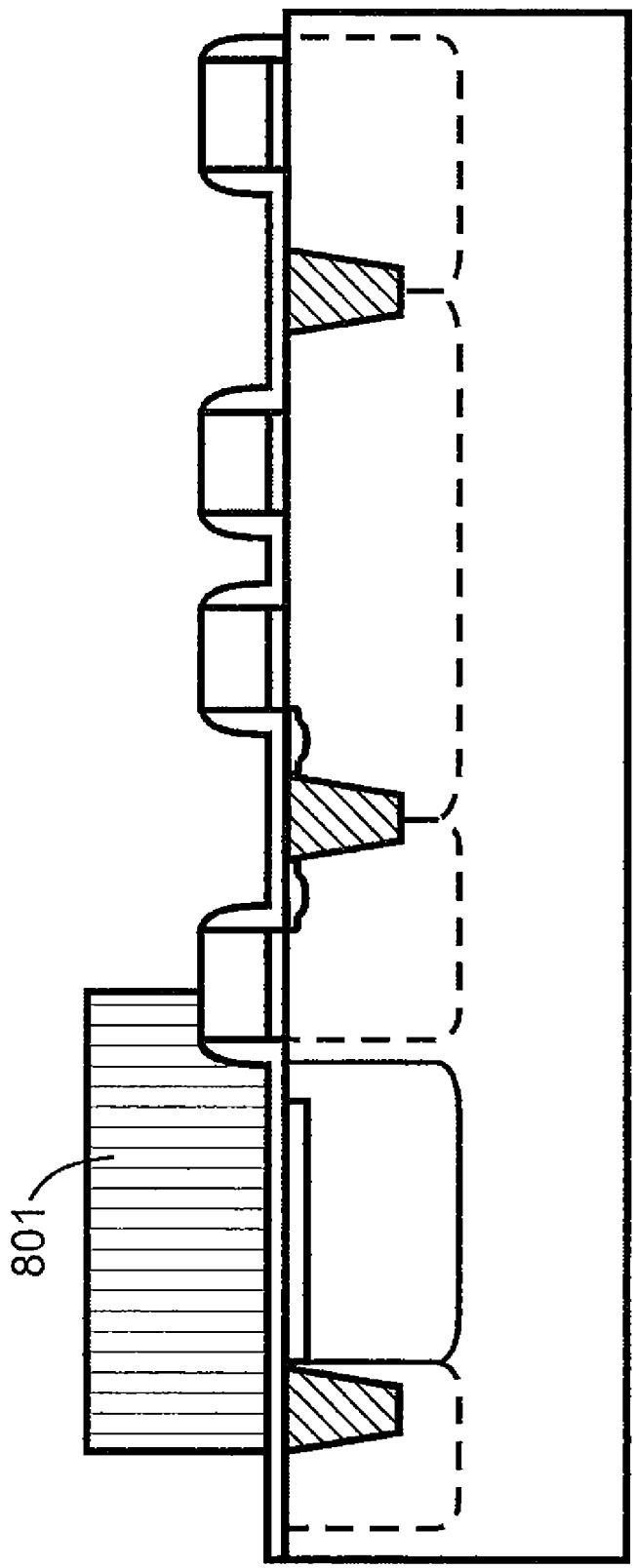

As shown in FIG. 8, the method includes depositing a masking layer 801 overlying the photosensitive region while exposing other regions. The masking layer can be a photoresist material in a specific embodiment. The masking layer protects the bottom silicon oxide layer and gate dielectric layer overlying the semiconductor substrate as well as the gate dielectric substrate interface region in the photosensitive region during a subsequent spacer etch process in a preferred embodiment. Of course there can be other variations, modifications, and alternatives.

Figure 9:
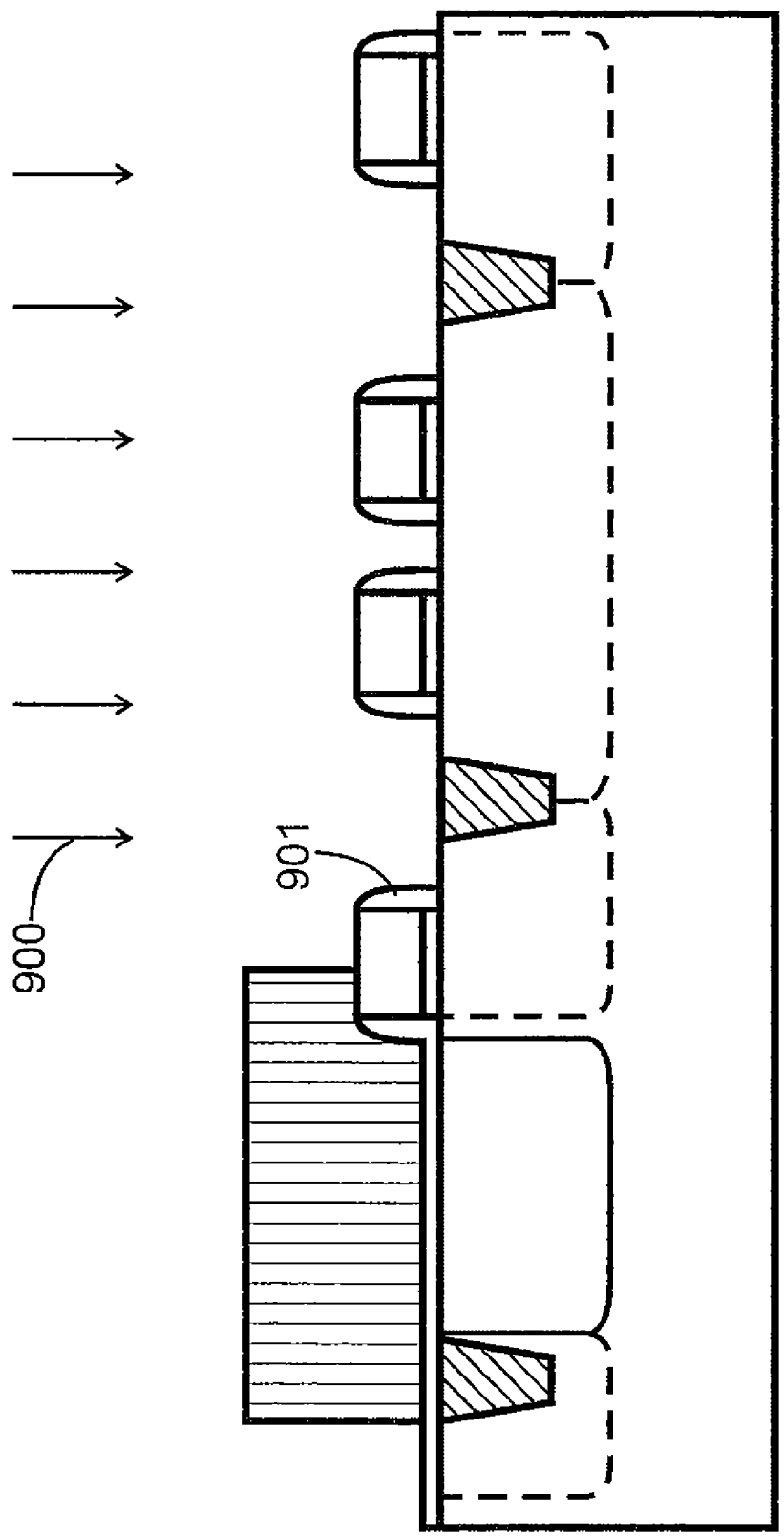

Referring to FIG. 9, the method performs a spacer etch process 900 to form spacer structures 901 while the photodiode region is being masked. The spacer etch process includes an anisotropic etch in a plasma environment in a specific embodiment. The spacer etch process removes the silicon oxide layer overlying the substrate in the un-masked region. In a specific embodiment, the spacer structure includes an ONO stack overlying the side portion of the gate structure. As shown, the spacer structure overlies the side portion of the gate structure and isolates the gate structure from the substrate. Of course they can be other variations, modifications, and alternatives.

The method continues with other process steps to complete the CMOS image sensor device. These other process steps include deposition of interlayer dielectric, conductor/metal layers, and protective layers among others. Of course there can be other variations, modifications, and alternatives.

Figure 10:
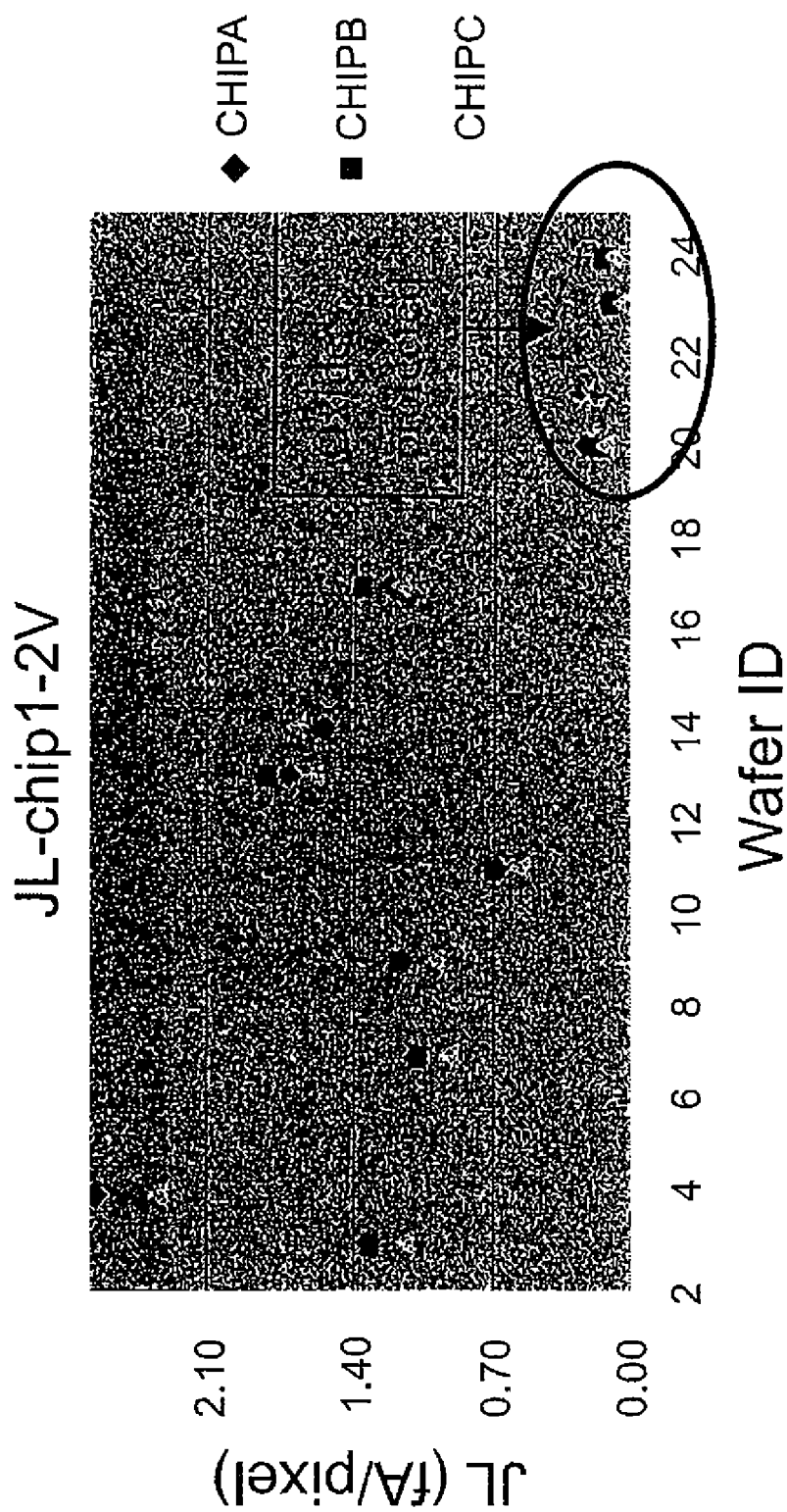
FIG. 10 is a simplified plot comparing photodiode junction leakage according to embodiments of the present invention.

FIG. 10 is a simplified plot comparing photodiode junction leakage according to embodiments of the present invention. As shown, vertical axis illustrates junction leakage current for the photodiodes in fA per pixel and the horizontal axis illustrates wafer id number. Wafers ID# 20-24 include surface silicon oxide protected using a masking layer on the photosensitive regions during spacer etch process. Wafers 2-18 use a conventional CMOS spacer etch process. As shown, the damage to the oxide/silicon in the photodiode region is eliminated resulting in a reduction of leakage current or dark current according to a specific embodiment. Of course there can be other variations, modifications, and alternatives.

While the above is a full description of the specific embodiments, various modifications, alternative constructions and equivalents may be used. For example, the above specification has been described using a P type substrate and a photodiode device region using a N type impurity, an N type substrate and a photodiode device region using P type impurity can also be used. Additionally, the isolation region can be formed using other isolation structures such as a field oxide region among others. Therefore, the above description and illustrations should not be taken as limiting the scope of the present invention which is defined by the appended claims.

What is claimed is:

1. A method of forming a CMOS image sensor device, the method comprising:
   providing a semiconductor substrate having a P-type impurity characteristic, the semiconductor substrate includes a surface region;
   forming a gate oxide layer overlying the surface region;
   forming a first gate structure overlying a first portion of the gate oxide layer, the first gate structure has a top surface region and at least a side region;
   forming an N-type impurity region in a portion of the semiconductor substrate to form a photodiode device region from at least the N-type impurity region and the P-type impurity;
   forming a blanket spacer layer including an oxide on nitride on oxide (ONO) structure overlying at least the first gate structure, the ONO structure having a nitride layer sandwiched between a top oxide layer and a bottom oxide layer; and
   removing the top oxide layer, the nitride layer, and a portion of the bottom oxide layer of the ONO structure to form one or more spacer structures for the first gate structure, wherein a remaining bottom oxide layer covers the entire photodiode device region.

2. The method of claim 1 wherein the bottom oxide layer is free from nitride.

3. The method of claim 1 wherein the bottom oxide layer is a stop layer.

4. The method of claim 1 wherein the bottom oxide layer reduces one or more surface defects on the N-type impurity region and an interface between the substrate surface in the N-type region and the gate oxide layer.

5. The method of claim 1 wherein the bottom oxide layer has a thickness of about 180 Angstroms and greater.

6. The method of claim 1 wherein the bottom oxide layer has a thickness of at least 100 Angstroms.

7. The method of claim 1 wherein the removing the top oxide layer, the nitride layer, and a portion of the bottom oxide layer of the ONO structure comprises a spacer etch process.

8. The method of claim 7 wherein the remaining bottom oxide layer overlying the photodiode device region is protected using a masking layer during the spacer etch process.

9. The method of claim 8 wherein the masking layer comprises a photoresist material.

10. The method of claim 1 wherein the bottom oxide layer overlying the photodiode region reduces defects to the gate oxide layer and gate oxide/substrate interface in the photodiode region during the spacer etch process.

11. The method of claim 1 wherein the CMOS image sensor device has a reduced dark current leakage.

12. The method of claim 1 wherein the remaining bottom oxide layer comprises a thickness ranging from about 80 Angstroms to about 200 Angstroms.

* * * * *